United States Patent [19]

Nogle

[11] Patent Number: 5,155,703
[45] Date of Patent: Oct. 13, 1992

[54] BICMOS BIT LINE LOAD FOR A MEMORY WITH IMPROVED RELIABILITY

[75] Inventor: Scott G. Nogle, Austin, Tex.

[73] Assignee: Motorola, Inc., Schaumburg, Ill.

[21] Appl. No.: 548,809

[22] Filed: Jul. 6, 1990

[51] Int. Cl.⁵ .............................................. G11C 11/40
[52] U.S. Cl. ................................ 365/190; 365/177; 365/189.09; 365/203; 307/544; 307/570
[58] Field of Search .............. 365/177, 189.09, 190, 365/203; 307/443, 456, 544, 570, 296.1, 296.7

[56] References Cited

U.S. PATENT DOCUMENTS

| | | | |
|---|---|---|---|
| 3,949,243 | 4/1976 | Sander et al. | 365/150 |
| 4,866,674 | 9/1989 | Tran | 365/189.11 |
| 4,899,317 | 2/1990 | Hoekstra et al. | 365/190 |

OTHER PUBLICATIONS

Tran et al, An 8ns BiCMOS 1Mb ECL SRAM with a Configurable Memory Array Size, 1989 IEEE So State Circuits Conference, pp. 36-37.

Kertis et al, A 12nd 256K BiCMOS STEAM, 1989 IEEE Solid State Circuits Conference, pp. 186-187.

Burnett and Hu, Hot-Carrier Degradation in Bipolar Transistors at 300 and 110K-Effect on BiCMOS Inverter Performance, IEEE Transaction of Electron Devices, vol. 37, No. 4, Apr. 1990, pp. 1171-1111.

Primary Examiner—Joseph L. Dixon
Assistant Examiner—Jack A. Lane
Attorney, Agent, or Firm—Paul J. Polansky

[57] ABSTRACT

A BICMOS (Bipolar Complementary Metal Oxide Semiconductor) bit line load for a memory with improved speed write recovery and improved reliability. Comprises a first bipolar transistor, a resistor, and a second and third bipolar transistors respectively coupled to first and second bit lines of a differential bit line pair. The improvement in speed is accomplished through the use of the bipolar transistors which generally switch faster than corresponding MOS transistors.

8 Claims, 3 Drawing Sheets

BICMOS BIT LINE LOAD FOR A MEMORY WITH IMPROVED RELIABILITY

FIELD OF THE INVENTION

This invention relates generally to memories having a read mode and a write mode, and more particularly, to memories storing data bits in memory cells and providing data to and receiving data from these memory cells via pairs of complementary signal lines.

BACKGROUND OF THE INVENTION

In an MOS static random access memory (SRAM), a data bit of a memory cell is typically read and written by a signal represented as a differential voltage between two bit lines. Multiple memory cells are coupled to one bit line pair and form a column of the memory, with each memory cell located on one row of the column. Each memory cell has a unique address at an intersection of a row and a column. The bit line pairs are commonly used for both reading data from and writing data to the memory cell. When a write cycle occurs, the data bit is driven onto the bit line pair as a differential voltage between the two bit lines. The differential voltage is large enough to overwrite an existing value in the selected memory cell. Typically the differential voltage on the bit lines is approximately 3 volts. When a read cycle takes place, a selected memory cell places a data bit stored within the selected memory cell on the bit line pairs differentially also, and the differential voltage for the read cycle may be below 100 millivolts.

When a write cycle is completed, a read cycle begins, and the differential voltage remaining on the bit line pair at the end of the write cycle must be reduced to a level low enough so that the data is not erroneously written into a memory during the ensuing read cycle. The differential voltage on the bit line pair must also be reduced quickly so that the read cycle is not unnecessarily extended. This process is called write recovery. Write recovery may include either coupling a first bit line of a bit line pair to a second bit line of the bit line pair so that their voltages will approach each other (known as equalization), or coupling both lines to a reference voltage, commonly a 5-volt power supply voltage terminal $V_{DD}$ (known as precharging), or both. However, achieved, write recovery must make the voltages on the first and second bit lines of the bit line pair close enough so that data is not overwritten and that the correct data is sensed quickly during the read cycle.

Write recovery is typically achieved by circuits known as bit line loads, which are located on each bit line pair. At the termination of the write cycle the bit line loads either couple the first bit line to the second bit line of the bit line pairs, or couple each bit line to a power supply voltage terminal such as $V_{DD}$, or both. If bipolar-CMOS (BICMOS) technology is available, bipolar transistors, which are faster than corresponding CMOS transistors, may be used to precharge corresponding bit line pairs. The precharge voltage is equal to a base biasing signal, such as $V_{DD}$, minus a base-to-emitter voltage ($V_{BE}$) diode drop of a corresponding bipolar transistor.

However, during the write cycle, a data input buffer provides a relatively large differential signal on the bit lines in order to overwrite the contents of a selected memory cell. The differential voltage may exceed 3 volts. Since the biasing signal provided to the bases of the bipolar transistors in the bit line loads is at a logic low during the write cycle, a large reverse bias may be developed on the base-emitter junctions of the bipolar transistors. Bipolar transistors degrade in the reverse biased condition and as reverse bias increases, the amount of degradation increases. Therefore using bipolar transistors is subject to reliability problems in that the transistors may degrade over time, ultimately resulting in a failure of the memory.

SUMMARY OF THE INVENTION

Accordingly, there is provided, in one form, a bit line load coupled to a differential bit line pair in a block of the memory. The bit line load comprises first, second, and third transistors, and a resistor. The first transistor has a collector coupled to a power supply voltage terminal, a base for receiving a bias signal, and an emitter for providing a first reference voltage. The resistor has a first terminal coupled to the power supply voltage terminal, and a second terminal coupled to the emitter of the first transistor. The second transistor has a collector for receiving the first reference voltage, a base for receiving an equalization signal, and an emitter coupled to a bit line. The third transistor has a collector for receiving the first reference voltage, a base for receiving the equalization signal, and an emitter coupled to a complementary bit line.

These and other objects, features and advantages will be more clearly understood from the following detailed description taken in conjunction with the accompanying drawings.

DETAILED DESCRIPTION OF THE INVENTION

Figure 1:
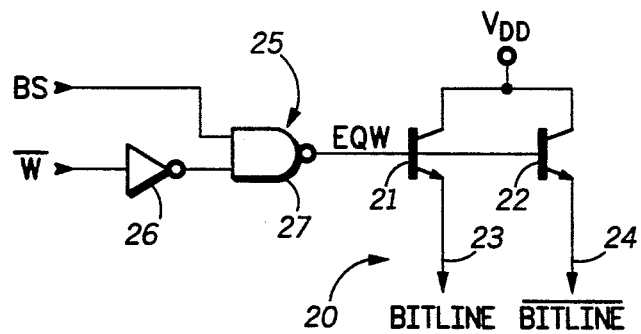
FIG. 1 illustrates in partial schematic form a bit line load in accordance with the prior art and a control circuit therefor.

FIG. 1 illustrates in partial schematic form a bit line load 20 in accordance with the prior art, and control circuit 25 therefor. See, for example, "Bitline Pull-Up Circuit for a BICMOS Read/Write Memory" by Tran in U.S. Pat. No. 4,866,674, issued Sep. 12, 1989; Kertis et. al., "A 12ns 256K BiCMOS SRAM", in 1989 *IEEE Solid State Circuits Conference*, p. 187. Bit line load 20 comprises an NPN transistor 21 having a collector connected to a positive power supply voltage terminal labelled "$V_{DD}$", a base for receiving a signal labelled "EQW", and an emitter coupled to a bit line 23 having a signal labelled "BITLINE" thereon; and an NPN transistor 22 having a collector connected to $V_{DD}$, a base for receiving signal EQW, and an emitter coupled to a bit line 24 having a signal labelled "$\overline{\text{BITLINE}}$" thereon. Control circuit 25 comprises an inverter 26 having an input terminal for receiving a write signal labelled "$\overline{W}$", and an output terminal; and a NAND gate 27 having a first input terminal for receiving a block select signal labelled "BS", a second input terminal connected to the output terminal of inverter 26, and an output terminal for providing EQW.

Signal EQW causes transistors 21 and 22 to precharge bit lines 23 and 24. EQW is asserted in response to either signal BS being negated as a logic low, or signal $\overline{W}$ being negated as a logic high. A write recovery period occurs between a time at which either BS or $\overline{W}$ is negated, until voltages on bitlines 23 and 24 are substantially equal. EQW is negated in response to both signals BS and $\overline{W}$ being asserted, indicating a write access to the memory block in which bit line load 20 is located. When EQW is asserted, transistors 21 and 22 increase the voltage on the corresponding bit line, bit line 23 or bit line 24 respectively, to a base-to-emitter threshold voltage ($V_{BE}$) below EQW. Also typically an MOS transistor, coupled between bit line 23 and bit line 24 (not shown in FIG. 1), is made conductive to equalize the voltage therebetween. Because bit line load 20 uses bipolar transistors 21 and 22, the speed of precharging of the voltage on the bit lines after the termination of the write cycle is improved over the use of CMOS transistors.

There is a problem with bit line load 20, however. During the write recovery period, bit line load 20 provides a voltage on bit lines 23 and 24 equal to approximately (EQW$-V_{BE}$). However, during a write cycle EQW is negated to a logic low. NAND gate 27, typically implemented using CMOS transistors, provides EQW at a logic low voltage very close to the negative power supply voltage, designated "$V_{SS}$", typically at zero volts. Hence, a large reverse bias is developed between the emitter and the base of either transistor 21 or transistor 22. If the maximum reverse bias is designated "$V_{RBMAX}$", then $$V_{RBMAX} = EQW - V_{BE} - V_{SS} \qquad (1)$$

If EQW is equal to 5 volts, $V_{BE}$ is equal to 0.7 volts, and $V_{SS}$ is equal to 0 volts, $V_{RBMAX}$ would equal 4.3 volts. Over time, the constant application of this large reverse bias may cause transistor 21 or transistor 22 to fail, resulting in a failure of the entire memory. Electronically, a large reverse bias on a PN junction causes hot carrier injection into the overlying oxide, resulting in poor junction performance. See, for example, "Hot-Carrier Degradation in Bipolar Transistors at 300 and 110K—Effect on BiCMOS Inverter Performance", by Burnett and Hu in *IEEE Transactions on Electron Devices*, vol. 37, no. 4, April 1990, pp. 1171-1173. The amount of hot carrier injection is proportional to the time the reverse bias occurs. The size of $V_{RBMAX}$ is related to the mean life of the transistor, for given worst case conditions, by an inverse semilogarithmic relationship; as $V_{RBMAX}$ decreases linearly, mean life increases exponentially. At a $V_{RBMAX}$ of 4.3 volts, transistor mean life of bit line load 20 is unacceptably short.

Figure 2:
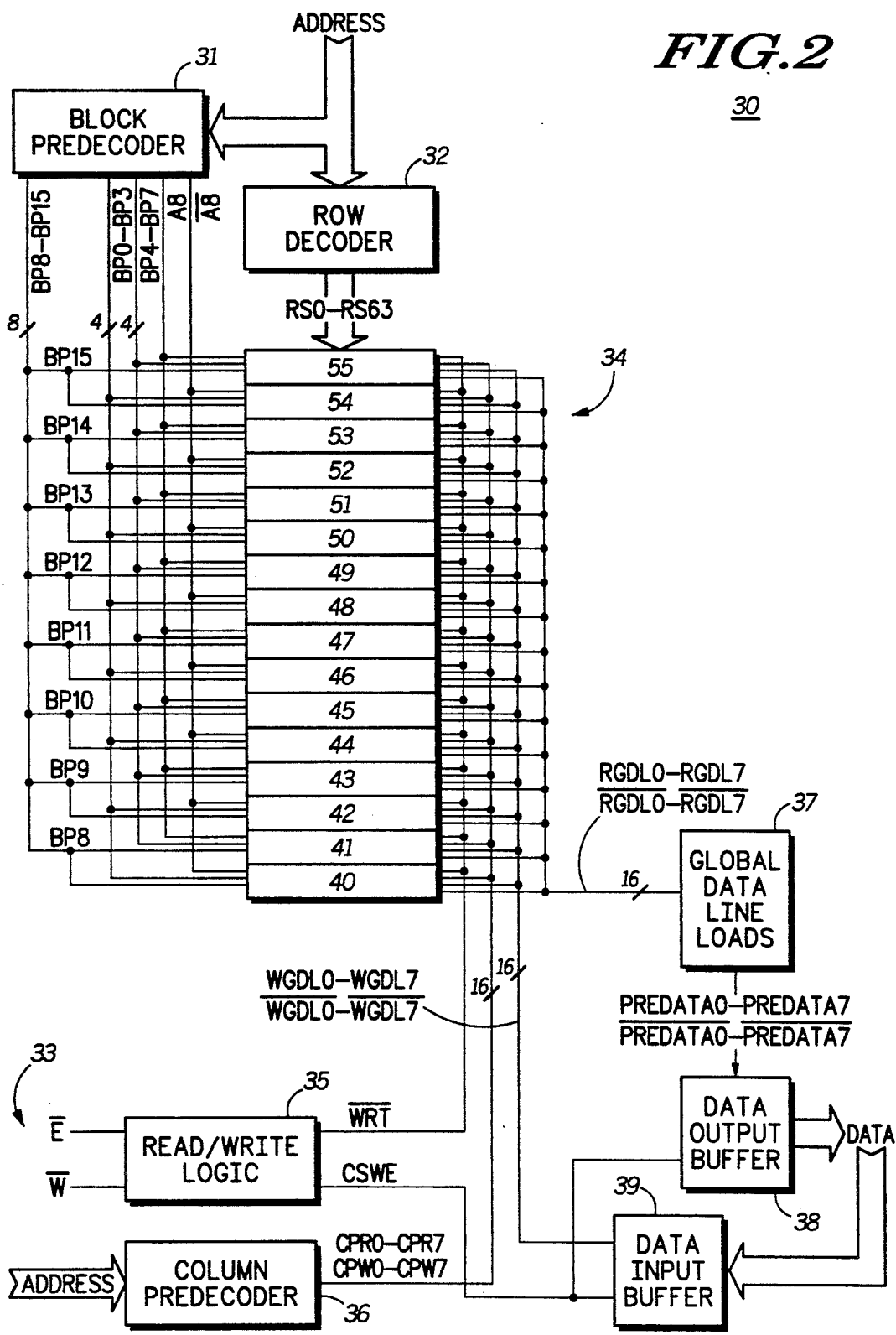
FIG. 2 illustrates in block form a memory incorporating the present invention.

FIG. 2 illustrates in block form a memory 30 incorporating the present invention. FIG. 2 shows features pertinent to understanding the present invention, but omits other features. Memory 30 comprises generally a block predecoder 31, a row decoder 32, an input/output portion 33, and a memory block portion 34. Input/output portion 33 comprises a read/write logic block 35, a column predecoder 36, a global data line load portion 37, a data output buffer 38, and a data input buffer 39. Memory block portion 34 comprises a plurality of memory blocks; in the illustrated embodiment, memory block portion 34 comprises sixteen memory blocks 40–55.

Block predecoder 31 receives a first portion of a plurality of address signals labelled "ADDRESS" and provides predecoded block signals labelled "A8", "$\overline{A8}$", "BP0-BP3", "BP4-BP7", and "BP8-BP15" in response. A particular memory block receives a unique combination of predecoded block signals which determines when the block is selected. Even-numbered memory blocks receive $\overline{A8}$, whereas odd-numbered blocks receive A8; memory blocks 40 and 41, 42 and 43, 44 and 45, 46 and 47, 48 and 49, 50 and 51, 52 and 53, and 54 and 55 respectively receive signals BP8, BP9, BP10, BP11, BP12, BP13, BP14, and BP15. Even-numbered memory blocks receive BP0-BP3, whereas odd-numbered memory blocks receive BP4-BP7, for further decoding. Row decoder 32 receives a second portion of ADDRESS and provides row select signals labelled "RS0-RS63" in response. RS0-RS63 are provided to each memory block.

Read/write logic block 35 receives as inputs an enable signal labelled "$\overline{E}$", and a write signal labelled "$\overline{W}$". Read/write logic block 35 provides a write signal labelled "$\overline{WRT}$" to each of memory blocks 40–55, and a control signal labelled "CSWE" to data output buffer 38 and data input buffer 39 in response. $\overline{WRT}$ is a buffered signal indicating a write cycle is in progress. CSWE is a signal indicating that either a read cycle or a write cycle is in progress. Column predecoder 36 receives a third portion of ADDRESS and provides a plurality of predecoded column signals labelled "CPR0-CPR7" and "CPW0-CPW7" in response. Global data line loads 37 couple to each of 8 differential global data line pairs labelled "RGDL0-RGDL7" and "$\overline{RGDL0}$-$\overline{RGDL7}$". Global data line loads 37 provide signals labelled signals labelled "PREDATA0--PREDATA7" and "$\overline{PREDATA0}$-$\overline{PREDATA7}$" in response. Data output buffer 38 couples to PREDATA0-PREDATA7 and $\overline{PREDATA0}$-$\overline{PREDATA7}$ and provides a plurality of data signals labelled "DATA" in response. The number of signals in DATA corresponds to the number of global data line pairs; here, there are eight data signals provided on DATA. However, the number of data bits provided by memory 30 may vary in different embodiments so the number of data signals in DATA is left indeterminate to illustrate this. Data input buffer 39 receives DATA and provides 8 write data line signal pairs labelled "WGDL0-WGDL7" and "$\overline{WGDL0}$-$\overline{WGDL7}$" in response.

FIG. 2 is useful in understanding the operation of a memory in which the present invention operates. Memory 30 is capable of performing read and write cycles. Memory 30 is organized as 16 blocks, with each block organized as 256 rows and 64 columns. A function which can be considered row decoding uses the first portion of the address to enable one block and to enable one local word line in the block. Thus, row decoding decodes one of 4096 local word lines in memory 30. The row decoding function encompasses block predecoder 31 and row decoder 32. A local word line is enabled in an enabled memory block in response to RS0-RS63 and a plurality of predecoded block signals received from block predecoder 31. Column decoding decodes eight bit line pairs out of 64 bit line pairs on the enabled local word line. Row redundancy is also possible but is not shown in FIG. 2. The organization of memory 30 may be altered in different embodiments, as well as which portions of ADDRESS are used respectively for row and column decoding.

In the read cycle, signal $\overline{E}$ is asserted and signal $\overline{W}$ is negated. Read/write logic block 35 keeps signals $\overline{WRT}$ and CSWE negated. Block predecoder 31 selectively asserts signals A8, $\overline{A8}$, and BP0–BP15 in response to the first portion of ADDRESS. Row decoder 32 selectively asserts a row select signal of RS0–RS63 in response to the second portion of ADDRESS. The memory block selected by the predecoded signals A8, $\overline{A8}$, and a corresponding signal from the group BP8–BP15, then uses the remaining predecoded signals BP0–BP7, along with an active row select signal of RS0–RS63, to activate one local word line. Then within the selected block, each memory cell on the activated local word line provides its contents onto a corresponding differential bit line pair. Further column decoding among the bit line pairs is performed using CPR0–CPR7. The type of cycle in progress determines which signal is asserted, either one of CPR0–CPR7 for a read cycle, or one of CPW0–CPW7 for a write cycle. During the read cycle, one signal of CPR0–CPR7 is asserted to select one of eight bit line pairs in a selected memory block to output on a corresponding global data line pair. Thus, CPR0–CPR7 decode 8 of 64 bit lines. Eventually, eight bit line pairs are selected. A selected memory cell thus is located at an intersection of an enabled local word line and a selected bit line pair, in an enabled memory block.

The differential voltage on each of the eight selected bit line pairs is received and sensed by global data line loads 37 which convert the output of the memory blocks, a differential current, into a differential voltage on signals PREDATA0–PREDATA7 and $\overline{PREDATA0}$–$\overline{PREDATA7}$. The data bits represented differentially as PREDATA0–PREDATA7 and $\overline{PREDATA0}$–$\overline{PREDATA7}$ are then provided externally to memory 30 by data output buffer 38.

In the write cycle, the flow of data is essentially reversed. Data input buffer 39 receives DATA and provides each data bit differentially onto a corresponding write global data line pair in response. Since memory 30 is organized to store or provide eight data bits of memory per access, DATA is provided on eight differential write global data line pairs WGDL0–WGDL7 and $\overline{WGDL0}$–$\overline{WGDL7}$. Signals CPW0–CPW7 from column predecoder 36 are used in a selected memory block to perform column decoding to couple the eight write global data lines to eight bit line pairs. During the write cycle, one signal of CPW0–CPW7 is asserted to select one of eight bit line pairs in a selected memory block to output on a corresponding global data line pair. Thus, CPW0–CPW7 decode 8 of 64 bit lines. The local word line decoding occurs in the same manner as for the read cycle. The differential voltage developed on the bit line pairs is much larger for the write cycle than for the read cycle in order to overwrite the contents of the selected memory cells.

Figure 3:
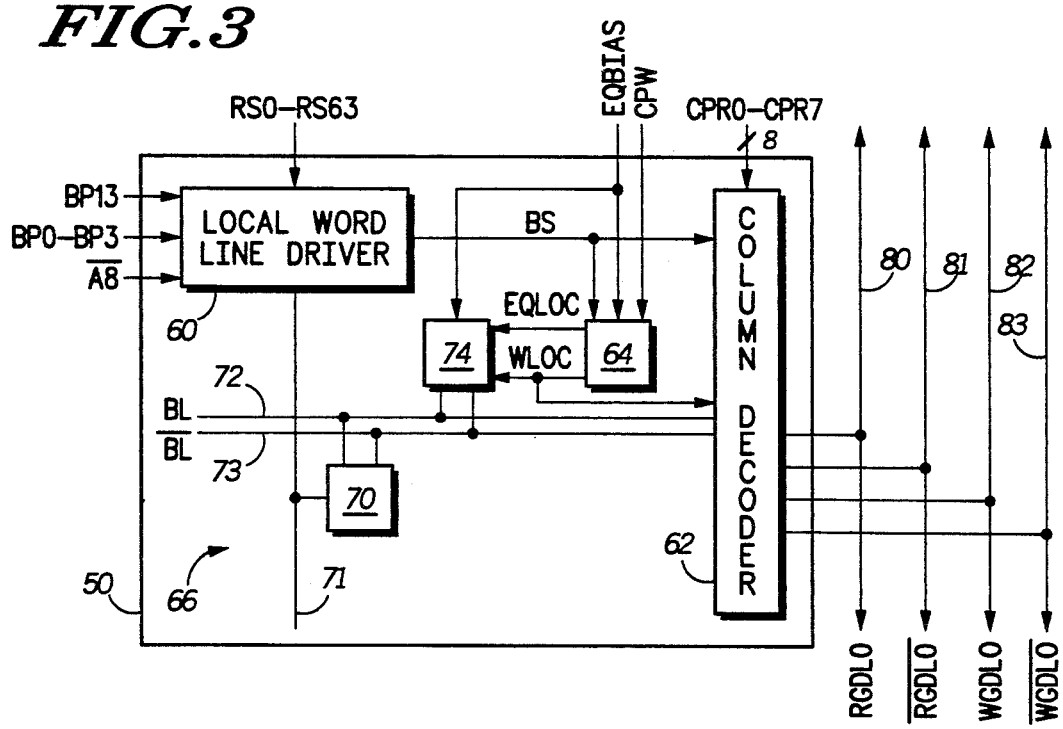
FIG. 3 shows a block diagram of a portion of a memory block of the memory of FIG. 2.

FIG. 3 illustrates in block form a portion of memory block 50 of memory 30 of FIG. 2. Memory block 50 comprises a local word line driver block 60, a column decoder 62, a control signal generator circuit 64, and a memory array 66. Local word line driver block 60 provides 256 local word line signals, including a representative local word line 71, in response to input row select signals RS0–RS63, block signals BP0–BP3 and BP13, and $\overline{A8}$. In addition, it provides a block select signal labelled "BS" in response to BP13 and $\overline{A8}$. Memory array 66 comprises a plurality of memory cells at each intersection of a local word line and a bit line pair. In FIG. 3, a respresentative memory cell 70 is located at an intersection of local word line 71 and a bit line pair comprising a bit line 72 providing a signal labelled "BL" thereon, and a bit line 73 providing a signal labelled "$\overline{BL}$" thereon. Bit lines 72 and 73 are coupled to column decoder 62. Column decoder 62 also receives a signal labelled "WLOC" and BS. WLOC is a signal of a group of signals labelled "WLOC0–WLOC7", not shown in FIG. 3, corresponding to the column address of memory cells on bit lines 72 and 73; it is designated generically to emphasize this fact. Coupled to bit lines 72 and 73 is bit line load 74, which receives as inputs EQBIAS, EQLOC, and WLOC. Control circuit 64 receives signals EQBIAS and CPW to provide signals EQLOC and WLOC. CPW is a signal of the group CPW0–CPW7, received by memory block 50, corresponding to the column address of memory cells on bit lines 72 and 73; it is designated generically to emphasize this fact. Other control circuits receive other corresponding predecoded column signals of the group CPW0–CPW7. Column decoder 62 receives eight signals CPR0–CPR7 and couples to each bit line pair in memory array 66, and couples to eight read global data line pairs (not all shown in FIG. 3). Shown in FIG. 3 is a read global data line pair comprising a first read global data line 80 providing RGDL0 thereon, and a second read global data line 81 providing $\overline{RGDL0}$ thereon, coupled to the output of column decoder 62; and a write global data line pair comprising a first write global data line 82 providing WGDL0 thereon, and a second write global data line 83 providing $\overline{WGDL0}$ thereon, coupled to an input of column decoder 62.

In operation, memory block 50 is selected by the assertion of predecoded signals $\overline{A8}$ and BP13. When $\overline{A8}$ and BP13 are asserted, local word line driver 60 asserts signal BS to activate selected bit line loads and to activate column decoding performed by column decoder 62. When memory block 50 is selected, local word line driver block 60 provides on of 256 word lines in response to RS0–RS63 and eight additional predecoded block signals BP0–BP7. In the read cycle, if memory block 50 is selected and local word line driver block 60 asserts local word line 71, then memory cell 70 couples a data bit stored therein differentially onto bit lines 72 and 73. Bit line load 74 provides an active pull up on bit lines 72 and 73. If a binary 1 is stored in memory cell 70, then a positive differential voltage is developed between BL and $\overline{BL}$. If a binary 0 is stored in memory cell 70, then a negative differential voltage is developed between BL and $\overline{BL}$. In either case, transistors in memory cell 70 have gate sizes sufficiently large to reduce a voltage provided by bit line load 74 enough so that a differential voltage may be recognized by column decoder 62. Column decoder 62 then decodes one pair of bit lines for each read global data line pair. Each selected bit line pair is coupled to a corresponding read global data line pair, and information stored in the corresponding selected memory cell is sensed and provided as a differential current onto the corresponding read global data line.

In the write cycle, data is provided differentially from eight write global data line pairs to corresponding selected memory cells. While the decoding occurs as in the read cycle, data is received by column decoder 62 during the write cycle from write global data lines 82 and 83 providing signals WGDL0 and $\overline{\text{WGDL0}}$ thereon. A principal difference between the read cycle and the write cycle is that during the read cycle a small differential voltage is developed on the bit line pair, but during the write cycle a large differential voltage is developed on the bit line pair by column decoder 62. While the voltage developed on the bit line pair during the write cycle must be large enough to overwrite a bit stored in a corresponding memory cell, the bit line load must precharge and equalize the voltage on the bit lines sufficiently after a write cycle to avoid disturbing a following read cycle.

Figure 4:
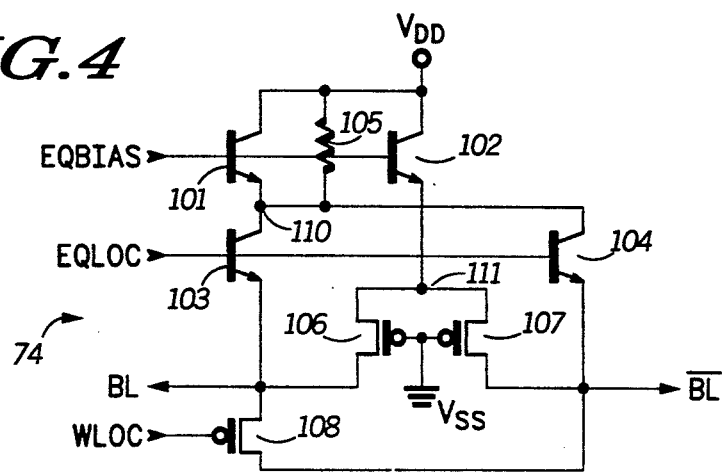
FIG. 4 illustrates in schematic form a bit line load and common voltage driver circuit shown in the memory block of FIG. 3.

FIG. 4 illustrates in schematic form bit line load 74 for use in memory 30, and NPN transistors 101 and 102 and resistor 105 used to bias bit line load 74. Bit line load 74 comprises NPN transistors 103, and 104; a resistor 105; and P-channel transistors 106, 107, and 108. Transistor 101 has a collector connected to $V_{DD}$, a base for receiving signal EQBIAS, and an emitter connected to a node 110. Transistor 102 has a collector connected to $V_{DD}$, a base for receiving signal EQBIAS, and an emitter connected to a node 111. Transistor 103 has a collector connected to node 110, a base for receiving signal EQLOC, and an emitter connected to bit line 72. Transistor 104 has a collector connected to node 110, a base for receiving signal EQLOC, and an emitter connected to bit line 73. Resistor 105 has a first terminal connected to $V_{DD}$, and a second terminal connected to node 110. Transistor 106 has a source connected to node 111, a gate connected to $V_{SS}$, and a drain connected to bit line 72. Transistor 107 has a source connected to node 111, a gate connected to $V_{SS}$, and a drain connected to bit line 73. Transistor 108 has a first current electrode connected to bit line 72, a gate for receiving signal WLOC, and a second current electrode connected to bit line 73. Which current electrode of transistor 108 functions as a source and which current electrode functions as a drain depends on the respective voltages on bit lines 72 and 73.

In basic operation, bit line load 74 serves two functions. First, bit line load 74 provides an active pull-up on both bit lines 72 and 73 for proper development of voltages BL and $\overline{\text{BL}}$ during the read cycle. During the read cycle, transistors 103 and 104 provide voltages on bit lines 72 and 73 in response to a differential current therefrom. In addition, transistors 106 and 107, which are always conductive, weakly pull up bit lines 72 and 73. Transistor 108 is also conductive during the read cycle to limit a differential voltage to a small amount, the small amount being just large enough to sense. Second, bit line load 74 equalizes and precharges the voltages on bit lines 72 and 73 during the write recovery period. Write recovery occurs during the transition from a write cycle to a read cycle. The precharging is accomplished by transistors 103 and 104 providing predetermined voltages on bit lines 72 and 73, and the equalization is accomplished by transistor 108 coupling together bit lines 72 and 73. The action of transistors 103, 104, and 108 ensures that voltages on bit lines 72 and 73 are substantially equal at the end of the write recovery period. Bit line load 74 provides an improvement over bit line load 20 of FIG. 1 because a worst-case reverse bias on bipolar transistors 103 and 104 is limited to a predetermined voltage, the predetermined voltage ensuring an acceptable mean life for the transistors under worst case conditions.

Specifically, transistor 101 provides a voltage on node 110 at one base-to-emitter diode voltage drop ($V_{BE}$) below the voltage on the signal EQBIAS, or (EQBIAS−$V_{BE}$). Similarly, transistor 102 provides a voltage on node 111 at a voltage equal to (EQBIAS−$V_{BE}$). Note that base-to-emitter diode voltage drop $V_{BE}$ is assumed to be equal for all transistors. In reality, bipolar transistor emitter size determines in part the $V_{BE}$ of a transistor; however, minor variations in $V_{BE}$ of the various transistors does not affect the invention. EQBIAS is set somewhat less than $V_{DD}$, and are made substantially independent of fluctuations in $V_{DD}$. If $V_{DD}$ is approximately 5 volts, EQBIAS may be set to approximately 4.2 volts. If the $V_{BE}$ of transistor 101 is 0.7 volts, then the voltage on node 110 is equal to approximately 3.5 volts.

During the write recovery period, transistors 103 and 104 increase the voltage on bit lines 72 and 73 to (EQLOC−$V_{BE}$). Signal EQLOC is provided at approximately EQBIAS during the read cycle. EQLOC is negated at a logic low of approximately two $V_{BE}$s above $V_{SS}$, about 1.4 volts, when a corresponding memory block is selected during the write cycle, and is asserted at a logic high of approximately EQBIAS, at about 4.2 volts, otherwise. The maximum reverse bias voltage ($V_{RBMAX}$) on transistors 103 and 104 occurs during a write cycle:

$$V_{RBMAX} = BL(HIGH) - EQLOC(LOW) \qquad (2)$$

or approximately 3.5−1.4=2.1 volts. If $V_{BE}$ is equal to 0.7 volts and $V_{SS}$ is equal to 0 volts, $V_{RBMAX}$ would equal approximately 2.1 volts, which is significantly less than that of prior art bit line load 20 of FIG. 1.

The voltage supplied by transistor 101 and resistor 105 on node 110 may be shared between several bit line loads; similarly the voltage provided by transistor 102 on node 111 may be shared between several bit line loads. Thus, bit line load 74 is an equivalent representation of the bit line load circuit and does not represent all components unique to each bit line load. In the preferred embodiment, node 110 is shared by 64 bit line loads; the voltage on node 110 is provided by eight identical circuits within block 50 each having components corresponding to transistor 101 and resistor 105. The voltage on node 111 is shared between all sixteen memory blocks 40-55 of FIG. 2, with each memory block providing an identical circuit, the circuit comprising a transistor corresponding to transistor 102 having an emitter connected to node 111.

The combination of transistor 101 and resistor 105 to provide the voltage on node 110 has certain desired effects for the prevention of self-boosting. Self-boosting occurs when the voltage on the base of a bipolar transistor increases rapidly, where the emitter is coupled to a highly capacitive load. The base-emitter PN junction has an associated junction capacitance; when the voltage on the base is suddenly increased, a large base-emitter voltage is developed (since the highly capacitively load resists a sudden increase in voltage). The capacitance of a PN junction increases greatly when the $V_{BE}$ exceeds one diode voltage drop. Therefore, the base-emitter junction capacitance boosts the level of the base as the voltage at the emitter rises. Self-boosting can be stopped by reducing the charge on the base. One way to reduce the charge on the base is to cause the transistor to go into saturation, by forward biasing the base-collector diode. Transistor 101 and resistor 105 decrease the effect of self-boosting on the bases of transistors 103 and 104 by decreasing the voltage on the collectors of transistors 103 and 104 when a large collector current flows (during write recovery). Resistor 105 causes the voltage on node 110 to be at $V_{DD}$ when substantially no current flows, which occurs when EQLOC is at a logic low. In actuality a small reverse saturation current flows but if resistor 105 is sized correctly this current can be ignored. When EQLOC switches to a logic high, either transistor 103 or 104 becomes initially active because its base-emitter junction is forward biased into a bit line at a low voltage, and its base-collector junction is reverse biased. A collector current is provided flowing into node 110. With an appreciable current, the voltage on node 110 begins to drop due to the IR drop in resistor 105. However, transistor 101 keeps the voltage on node 110 from dropping below (EQBIAS$-V_{BE}$). When the base voltage of transistor 103 or transistor 104 rises by one diode voltage drop above (EQBIAS$-V_{BE}$) the excess base charge is discharged through the base-collector diode, and self-boosting is stopped. As the collector current of transistor 103 decreases, resistor 105 increases the voltage on the collector of transistor 103 to bring transistor 103 out of saturation.

Referring again to FIG. 3, two sources of reverse bias on base-to-emitter junctions of transistors 103 and 104 of FIG. 4 may be identified. First, as previously discussed, a reverse bias may be formed during a write cycle. The voltage on bit lines 72 and 73 is (EQLOC$-V_{BE}$) when precharging is complete. During a write cycle, EQLOC is provided as a logic low voltage. Thus, a difference between a logic high voltage and a logic low voltage on EQLOC must be limited to a predetermined voltage to assure an acceptable transistor life under worst case conditions. Second, during the write cycle, data input buffer 39 of FIG. 2 provides a data bit to be stored differentially onto a write global data line pair. Column decoder 62 then uses predecoded column signals WLOC0–WLOC7 to couple the write global data line pairs to selected bit line pairs. To ensure that the worst case base-to-emitter reverse bias is less than the predetermined voltage established by EQLOC, data input buffer 39 of FIG. 2 limits a logic high voltage on a write global data line, for example WGDL0 or $\overline{WGDL0}$, to (EQLOC$-V_{BE}$). Note that column decoder 62 may decrease this voltage slightly when coupling the write global data lines to the bit line pairs.

Figure 5:
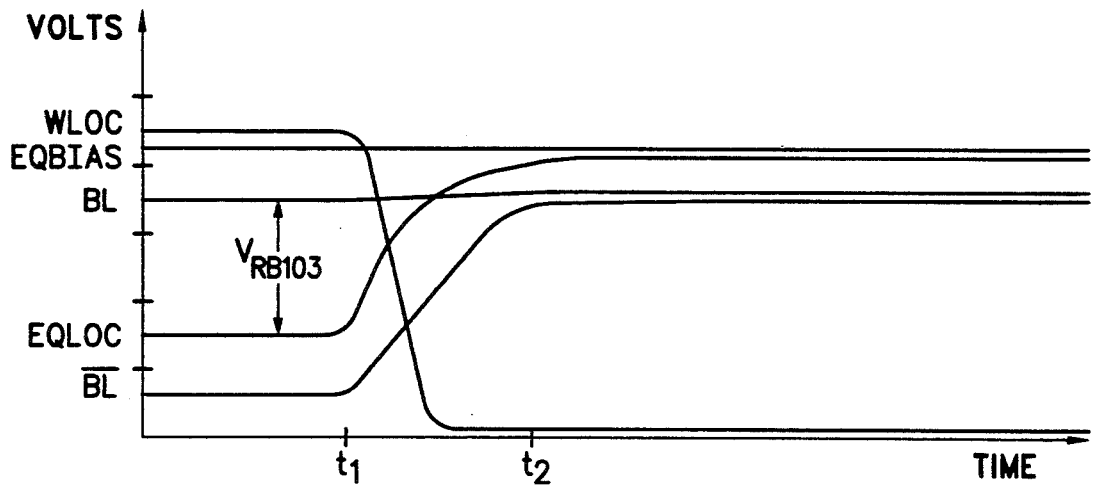
FIG. 5 illustrates a timing diagram of signals pertinent to FIG. 4.

Typical waveforms of control signals EQLOC and WLOC and other pertinent signals are shown in FIG. 5. The signals represented are WLOC, EQBIAS, BL, $\overline{BL}$, and EQLOC. FIG. 5 shows the variation in voltage of each of the pertinent signals with respect to time. A point in time labelled "t1" along the horizontal axis represents approximately a time division between a write cycle and a read cycle. Before time t1, the write cycle is in progress; between t1 and a time labelled "t2" is the write recovery period. EQBIAS is constant at approximately 4.2 volts. During the write cycle, a voltage is developed between BL and $\overline{BL}$. As prevously noted, the voltage on BL and $\overline{BL}$ is provided by data input buffer 39 of FIG. 2 onto write global data lines which are coupled to column decoder 62 of FIG. 3 to selected bit line pairs. In the illustrated example a binary 1 is being provided as a positive differential voltage between BL and $\overline{BL}$. BL is at approximately 3.5 volts, while $\overline{BL}$ is approximately one $V_{BE}$ above $V_{SS}$, or about 0.7 volts. Therefore, there is a differential voltage of about 2.8 volts which is sufficient to ensure a fast transfer of data when the contents of a selected memory cell are overwritten during the write cycle. EQLOC is at ($V_{SS}+2V_{BE}$), or about 1.4 volts. When the write recovery period begins, EQLOC begins to rise at t1. As EQLOC rises, $\overline{BL}$ also rises. At the same time, WLOC is negated, which makes transistor 108 of FIG. 4 conductive, coupling bit lines 72 and 73 together. The voltage on $\overline{BL}$ rises until, at a time labelled "t2", it approximately equals the voltage on BL. The maximum reverse bias, labelled "$V_{RB103}$", occurs in this case on transistor 103. In the illustrated embodiment, $V_{RB103}$ is $3.5-1.4=2.1$ volts. $V_{RB103}$ is therefore much less than the $V_{RBMAX}$ of 4.3 volts associated with prior art bit line load 20 of FIG. 1. The logic high and logic low voltages chosen for EQLOC, the source voltages of transistors 106 and 107 (shown in FIG. 4), and the voltages provided by data input buffer 39 (shown in FIG. 2) which are eventually coupled to corresponding bit lines, assure a worst case reverse bias of approximately 2.1 volts to guarantee a mean transistor lifetime of at least 10 years under worst case conditions. The logic high and logic low voltages for EQLOC also assure a fast transfer of data during the write cycle. The worst case conditions occur when a given memory cell is continually written to, at maximum specified voltage for $V_{DD}$, and at minimum specified temperature. Note that other transistor lifetimes may be assured by choosing smaller worst-case reverse-bias voltages.

Figure 6:
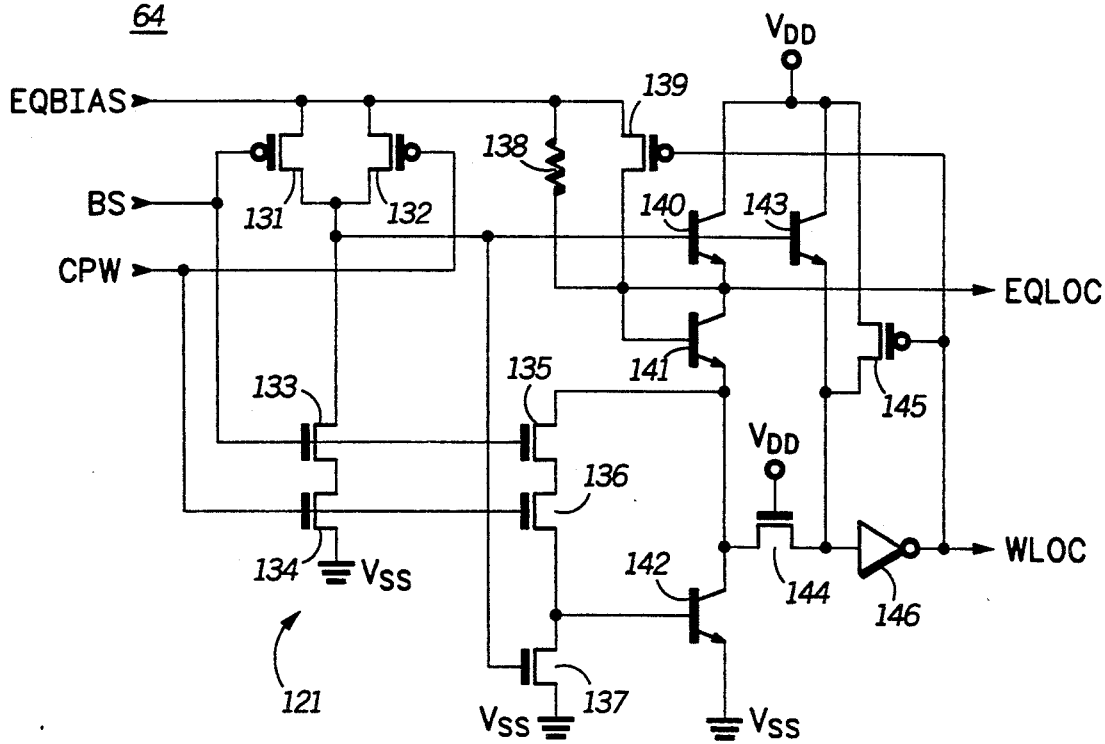
FIG. 6 illustrates in partial schematic form the bit line load control circuit of FIG. 3 for use with the bit line load of FIG. 4.

FIG. 6 illustrates in partial schematic form control signal generator circuit 64 for use with the bit line load of FIG. 4. Circuit 64 comprises a NAND gate 121, N-channel transistors 135, 136, and 137, a resistor 138, a P-channel transistor 139, NPN transistors 140, 141, 142, and 143, an N-channel transistor 144, a P-channel transistor 145, and an inverter 146. NAND gate 121 comprises P-channel transistors 131 and 132, and N-channel transistors 133 and 134.

Transistor 131 has a source connected to EQBIAS, a gate for receiving signal BS, and a drain providing an output terminal of NAND gate 121. Transistor 132 has a source connected to EQBIAS, a gate for receiving signal labelled "CPW", and a drain connected to the drain of transistor 131. Transistor 133 has a drain connected to the drain of transistor 131, a gate for receiving signal BS, and a source. Transistor 132 has a drain connected to the source of transistor 133, a gate for receiving signal CPW, and a source connected to $V_{SS}$. Transistor 135 has a drain, a gate for receiving signal BS, and a source. Transistor 136 has a drain connected to the source of transistor 135, a gate for receiving signal CPW, and a source. Transistor 137 has a drain connected to the source of transistor 136, a gate connected to the drain of transistor 131, and a source connected to $V_{SS}$. Resistor 138 has a first terminal connected to EQBIAS, and a second terminal for providing EQLOC. Transistor 139 has a source connected to EQBIAS, a gate for receiving signal WLOC, and a drain connected to the second terminal of resistor 138. Transistor 140 has a collector connected to $V_{DD}$, a base connected to the drain of transistor 131, and an emitter connected to the second terminal of resistor 138 and the drain of transistor 139. Transistor 141 has a collector connected to the emitter of transistor 140, a base connected to the second terminal of resistor 138 and to the drain of transistor 139, and an emitter connected to the drain of transistor 135. Transistor 142 has a collector connected to the emitter of transistor 141, a base connected to the drain of transistor 137, and an emitter connected to $V_{SS}$. Transistor 143 has a collector connected to $V_{DD}$, a base connected to the drain of transistor 131, and an emitter. Transistor 144 has a first current electrode connected to the emitter of transistor 141, a gate connected to $V_{DD}$, and a second current electrode connected to the emitter of transistor 143. Transistor 145 has a source connected to $V_{DD}$, a gate for receiving signal WLOC, and a drain connected to the emitter of transistor 143. Inverter 146 has an input terminal connected to the emitter of transistor 143, and an output terminal for providing signal WLOC.

Circuit 64 may be understood first by the logical relation established between the input signals, and then by the way the components shown in FIG. 6 perform the functions. BS is a signal asserted at a logic high when a block in which a corresponding bit line pair is located is enabled. CPW is a signal asserted at a logic high when a write to the corresponding bit line pairs occurs, and corresponds to one signal of the group CPW0-CPW7. EQLOC, provided on the emitter of transistor 140, is a logical NAND between signals BS and CPW. WLOC, on the other hand, is provided as an inverse of the logical NAND between CPW and BS; in other words, as a logical AND between BS and CPW. While WLOC is provided at CMOS levels, with a logic high of approximately $V_{DD}$ and a logic low of approximately $V_{SS}$, EQLOC is provided with a logic high of approximately EQBIAS, and a logic low of approximately $V_{SS}+2V_{BE}$. As described earlier, limitation of the logic low voltage of EQLOC improves the mean lifetime of transistors 103 and 104 of FIG. 4.

The output terminal of NAND gate 121 is provided by the drain of transistor 131. When the output terminal of NAND gate 121 is a logic high, the base-emitter junction of transistor 140 becomes forward biased to provide EQLOC as a logic high. When the output of NAND gate 121 is a logic high, either transistor 131 or transistor 132, or both, is conductive. Since both transistors 131 and 132 are P-channel transistors connected to voltage EQBIAS, at approximately 4.2 volts, a logic low voltage on the ga gates makes the transistors conductive. A drain-to-source voltage $V_{DS}$ of each transistor is approximately zero volts, and the voltage on the output terminal of NAND gate 121 is approximately at EQBIAS. Therefore, the logic high voltage of EQLOC is approximately EQBIAS. On the other hand, (EQBIAS$-V_{BE}$) appears on the input terminal of inverter 146 and is latched to $V_{DD}$ by transistor 145. This voltage is recognized as a logic high by inverter 146, and the output terminal of inverter 136 is driven to a logic low. Transistor 139 is placed into saturation, increasing EQLOC to EQBIAS. In essence, then, inverter 146 and transistor 139 form a weak latch to increase EQLOC to EQBIAS once EQLOC crosses from a logic low to a logic high. Transistor 137 is made conductive by the output of NAND gate 121, and couples the base of transistor 142 to $V_{SS}$, keeping the base-emitter junction of transistor 142 from becoming forward biased, and therefore keeping any current from flowing into the collector of transistor 141 or 142.

When the output terminal of NAND gate 121 is a logic low, caused by both BS and CPW being a logic high, EQLOC is provided at approximately ($V_{SS}+2V_{BE}$). The base-emitter junction of transistor 140 becomes reverse biased, and transistor 139 becomes nonconductive. Transistors 135 and 136 both become conductive and couple the collector of transistor 142 to the base of transistor 142. Transistor 137 becomes nonconductive. Therefore, EQLOC is connected to $V_{SS}$ through two diode-connected transistors 141 and 142. Resistor 138 provides the bias current to keep the base-to-emitter diodes of transistors 141 and 142 forward biased.

With regard to WLOC, when the output of NAND gate 121 is a logic high, the voltage on the input terminal of inverter 146 is a logic high, and the output terminal of inverter 146 is a logic low. Transistor 145 then becomes conductive to provide a weak latch when the voltage at the input terminal of inverter 146 crosses from a logic low to logic high. When the output of NAND gate 121 switches to a logic low, transistor 143 becomes nonconductive. The high voltage developed on the input terminal of inverter 146 then causes transistor 144 to be conductive and to discharge the voltage on the input terminal of inverter 146 through transistor 142 to $V_{SS}$, until it passes below the switchpoint of inverter 146. It should be remembered that circuit 64 is but one embodiment for providing the waveforms shown in FIG. 5, and that other circuits are possible.

It should be apparent by now that a memory with improved write recovery and improved reliability has been described. In the illustrated embodiment the memory comprises a plurality of memory blocks, each memory block having a plurality of memory cells located at intersections of local word lines and bit line pairs. Coupled to each bit line pair is a bit line load comprising first and second bipolar transistors, and third, fourth, and fifth P-channel MOS transistors. The first and second bipolar transistors are biased such that a worst-case reverse bias is limited to a predetermined voltage. The limitation of the worst-case reverse bias results from limiting the logic high voltage on the equalization signal used to bias the bases of the first and second transistors, providing a minimum logic low voltage on the equalization signal, and limiting the logic high voltage on the bit lines during the write cycle. The predetermined voltage is chosen so that the application of the worst-case reverse bias assures a given mean lifetime under worst case conditions, of the first and second transistors. Using bipolar transistors, the bit line load provides a fast write recovery, and the limitation of the worst case reverse bias improves reliability.

While the invention has been described in the context of a preferred embodiment, it will be apparent to those skilled in the art that the present invention may be modified in numerous ways and may assume many embodiments other than that specifically set out and described above. For example, the present invention may be used in conjunction with other types of memory storage elements like a register set in a microprocessor, and is not limited to use in single-chip memories. Accordingly, it is intended by the appended claims to cover all modifications of the invention which fall within the true spirit and scope of the invention.

I claim:

1. A bit line load coupled to a differential bit line pair in a block of a memory, the memory for performing read cycles and write cycles, comprising:

bias means for providing an equalization signal at a logic low voltage when the memory block is selected during the write cycle, and for providing said equalization signal at a logic high voltage otherwise;

a first transistor having a collector for receiving a first reference voltage, a base for receiving said equalization signal, and an emitter coupled to a bit line;

a second transistor having a collector for receiving said first reference voltage, a base for receiving said equalization signal, and an emitter coupled to a complementary bit line;

a third transistor having a first current electrode for receiving a second reference voltage, a control electrode coupled to a negative power supply voltage terminal, and a second current electrode coupled to said bit line; and a fourth transistor having a first current electrode for receiving said second reference voltage, a control electrode coupled to said negative power supply voltage terminal, and a second current electrode coupled to said complementary bit line;

a fifth transistor having a collector coupled to a positive power supply voltage terminal, a base for receiving a first bias signal, and an emitter for providing said first reference voltage; and a resistor having a first terminal coupled to said positive power supply voltage terminal, and a second terminal coupled to said emitter of said fifth transistor;

wherein a difference between said logic high voltage of said equalization signal minus one base-to-emitter diode voltage drop of either said first transistor or said second transistor, and said logic low voltage of said equalization signal, is limited to a predetermined voltage, said predetermined voltage assuring a given mean transistor life under worst case conditions.

2. The bit line load of claim 1 wherein said second reference voltage is provided by a sixth transistor having a collector coupled to said positive power supply voltage terminal, a base for receiving said first bias signal, and an emitter for providing said second reference voltage.

3. The bit load of claim 2 wherein said first bias signal is substantially equal to a logic high voltage of said equalization signal.

4. The bit line load of claim 3 wherein said second reference voltage is substantially equal to said first reference voltage.

5. A bit line load coupled to a differential bit line pair in a block of a memory comprising:

a first transistor having a collector coupled to a power supply voltage terminal, base for receiving a bias signal, and an emitter for providing a first reference voltage;

a resistor having a first terminal coupled to said power supply voltage terminal, and a second terminal coupled to said emitter of said first transistor;

a second transistor having a collector for receiving said first reference voltage, a base for receiving an equalization signal, and an emitter coupled to a bit line; and a thrid transistor having a collector for receiving said first reference voltage, a base for receiving said equalization signal, and an emitter coupled to a complementary bit line.

6. The bit line load of claim 5 further comprising:

a fourth transistor having a first current electrode couple to said bit line, a control electrode coupled to a second power supply voltage terminal, and a second current electrode for receiving a second reference voltage; and a fifth transistor having a first current electrode coupled to said complementary bit line, a control electrode coupled to said second power supply voltage terminal, and a second current electrode for receiving said second reference voltage.

7. The bit line load of claim 6 further comprising: a sixth transistor having a first current eletrode coupled to said bit line, a control electrode for receiving a second equalization signal, and a second current electrode coupled to said complementary bit line.

8. The bit line load of claim 6 wherein said second reference voltage is provided by a seventh transistor having a collector coupled to said power supply voltage terminal, a base for receiving said bias signal, and an emitter for providing said second reference voltage.

* * * * *

UNITED STATES PATENT AND TRADEMARK OFFICE
CERTIFICATE OF CORRECTION

PATENT NO. : 5,155,703
DATED : Oct. 13, 1992
INVENTOR(S) : Nogle

It is certified that error appears in the above-identified patent and that said Letters Patent is hereby corrected as shown below:

Item [57] ABSTRACT:
Line 4, change "Comprises", to --comprises--; delete the third occurrence of "a".
Line 9, after "transistors.", add --The first bipolar transistor has a collector coupled to a power supply voltage terminal, a base for receiving a bias signal, and an emitter coupled to the collectors of the second and third bipolar transistors. The resistor is coupled between the collector and emitter of the first bipolar transistor. The bit line load has improved reliability by preventing self-boosting at the bases of the second and third bipolar transistors by decreasing their collector voltages enough during switching to bias them into saturation.--.

Signed and Sealed this

Eighteenth Day of January, 1994

Attest:

BRUCE LEHMAN

*Attesting Officer*     *Commissioner of Patents and Trademarks*